United States Patent
Kim

(10) Patent No.: US 11,790,965 B2
(45) Date of Patent: Oct. 17, 2023

(54) SEMICONDUCTOR DEVICE

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/896,956

(22) Filed: Aug. 26, 2022

(65) Prior Publication Data

US 2022/0415375 A1 Dec. 29, 2022

Related U.S. Application Data

(62) Division of application No. 17/195,294, filed on Mar. 8, 2021, now Pat. No. 11,462,251.

(30) Foreign Application Priority Data

Aug. 4, 2020 (KR) .......................... 10-2020-0097658

(51) Int. Cl.
*G11C 7/00* (2006.01)
*G11C 7/22* (2006.01)
*G11C 7/10* (2006.01)

(52) U.S. Cl.
CPC ............ *G11C 7/222* (2013.01); *G11C 7/1096* (2013.01)

(58) Field of Classification Search
CPC .................................................... G11C 7/1048
USPC ........................................................ 365/203
See application file for complete search history.

(56) References Cited

U.S. PATENT DOCUMENTS

| 6,563,760 | B2 | 5/2003 | Song |
| 9,659,615 | B1 | 5/2017 | Kwak et al. |
| 10,014,866 | B2 | 7/2018 | Vasudevan et al. |
| 2017/0110173 | A1* | 4/2017 | Matsuno ............... G11C 7/1039 |

FOREIGN PATENT DOCUMENTS

| KR | 1020080060375 A | 7/2008 |
| KR | 1020090045695 A | 5/2009 |
| KR | 1020170126882 A | 11/2017 |

* cited by examiner

*Primary Examiner* — Hoai V Ho
(74) *Attorney, Agent, or Firm* — WILLIAM PARK & ASSOCIATES LTD.

(57) ABSTRACT

A semiconductor device includes an operation flag generation circuit configured to generate an operation flag at a time when a flag period elapses from a time when an internal setting signal is generated to perform a write operation accompanied by an auto-precharge operation; and an auto-precharge pulse generation circuit configured to generate an auto-precharge pulse by shifting the operation flag by a pulse generation period set by a period code based on divided docks generated by dividing an internal dock.

9 Claims, 11 Drawing Sheets

FIG.7

| WRC<6:1> | QC<3> | QC<2> | QC<1> | RC<7> | RC<6> | RC<5> | RC<4> | RC<3> | RC<2> | RC<1> |
|---|---|---|---|---|---|---|---|---|---|---|
| 54 | H | H | H | L | L | L | L | H | H | H |
| 52 | H | H | H | L | L | L | L | L | H | H |
| 50 | H | H | H | L | L | L | L | L | L | H |
| 48 | H | H | H | L | L | L | L | L | L | L |
| 46 | L | H | H | H | H | H | H | H | H | H |
| 44 | L | H | H | L | H | H | H | H | H | H |
| 42 | L | H | H | L | L | H | H | H | H | H |
| 40 | L | H | H | L | L | L | H | H | H | H |
| 38 | L | H | H | L | L | L | L | H | H | H |
| 36 | L | H | H | L | L | L | L | L | H | H |
| 34 | L | H | H | L | L | L | L | L | L | H |
| 32 | L | H | H | L | L | L | L | L | L | L |
| 30 | L | H | L | H | H | H | H | H | H | H |
| 16 | L | L | L | H | H | H | H | H | H | L |
| 14 | L | L | L | H | H | H | H | H | L | H |
| 2 | L | L | L | L | L | L | L | L | L | H |

SEMICONDUCTOR DEVICE

CROSS-REFERENCE TO RELATED APPLICATION

The present application is a divisional application of U.S. patent application Ser. No. 17/195,294, filed on Mar. 8, 2021, and claims priority under 35 U.S.C. § 119(a) to Korean Patent Application No. 10-2020-0097658 filed on Aug. 4, 2020 in the Korean Intellectual Property Office, which is incorporated herein by reference hi its entirety.

BACKGROUND

1. Technical Field

Embodiments of the disclosure generally relate to a semiconductor device, and more particularly, to a semiconductor device capable of performing an auto-precharge operation.

2. Related Art

As semiconductor devices increasingly operate at higher speeds, the semiconductor devices adopt a scheme of performing an auto-precharge operation instead of a scheme of performing a precharge operation by receiving a separate precharge command after a write operation is performed. The auto-precharge operation is performed in such a way to be automatically performed without receiving a separate command after the write operation is performed.

SUMMARY

In an embodiment, a semiconductor device may include: an operation flag generation circuit configured to generate an operation flag at a time when a flag period elapses from a time when an internal setting signal is generated to perform a write operation accompanied by an auto-precharge operation; and an auto-precharge pulse generation circuit configured to generate an auto-precharge pulse by shifting the operation flag by a pulse generation period set by a period code based on divided docks generated by dividing an internal clock.

In an embodiment, a semiconductor device may include: a shifting control signal generation circuit configured to generate a quotient code and a remainder code based on a pulse generation period; a pre-shifting circuit configured to generate a shifting operation flag by shifting an operation flag by a pre-shifting period set based on the remainder code, in synchronization with a first divided clock; and a shifting circuit configured to generate an auto-precharge pulse by shifting the shifting operation flag by a shifting period set based on the quotient code, in synchronization with a third divided clock.

BRIEF DESCRIPTION OF THE DRAWINGS

FIG. 7 is a representation of an example of a table to assist in the explanation of the operation of a shifting control signal generation circuit, included in the auto-precharge puke generation circuit illustrated in FIG. 6, in accordance with an embodiment of the disclosure.

DETAILED DESCRIPTION

Figure 1:
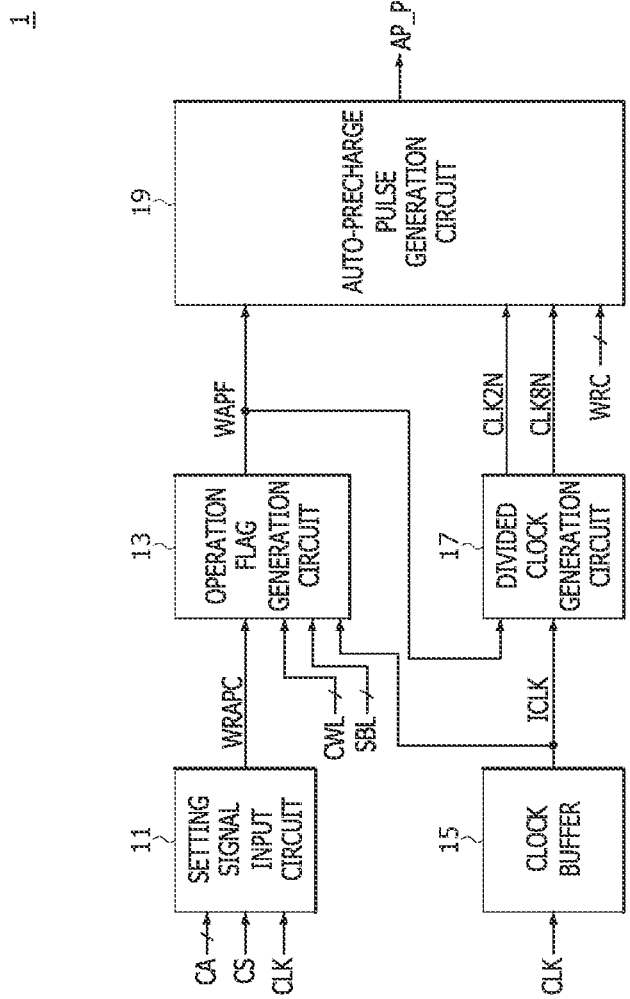
FIG. 1 is a block diagram illustrating a representation of an example of the configuration of a semiconductor device in accordance with an embodiment of the disclosure.

In the description of the following embodiments, the term "preset" means that the numerical value of a parameter is predetermined when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the component may be coupled or connected thereto directly or by the medium of a component. On the other hand, the descriptions of "directly coupled" and "directly connected" should be understood to mean that one component is coupled and connected to another component directly without intervention of a still another component.

"Logic high level" and "logic low level" are used to describe logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." Depending on an embodiment, a "logic high level" may be set to a level higher than a "logic low level," Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to imple lent the configurations.

Hereinafter, various examples of embodiments of the disclosure will be described with reference to the accompanying drawings. These embodiments are only for illustrating the disclosure, and the scope of protection of the disclosure is not limited by these embodiments.

Various embodiments may be directed to a semiconductor device which performs an auto-precharge operation.

According to the embodiments of the disclosure, an auto-precharge puke for an auto-precharge operation may be generated by shifting an operation flag, generated from an internal setting signal, using divided docks having various cycles. As a consequence, the use of shift registers may be minimized, thereby reducing an area and current consumption.

Also, according to the embodiments of the disclosure, the divided docks having various cycles may be reset based on the operation flag generated from the internal setting signal. As a consequence, the auto-precharge puke may be stably generated based on the divided docks which are aligned.

As illustrated in FIG. 1, a semiconductor device 1 in accordance with an embodiment of the disclosure may include a setting signal input circuit 11, an operation flag generation circuit 13, a dock buffer 15, a divided dock generation circuit 17 and an auto-precharge pulse generation circuit 19.

Figure 11:
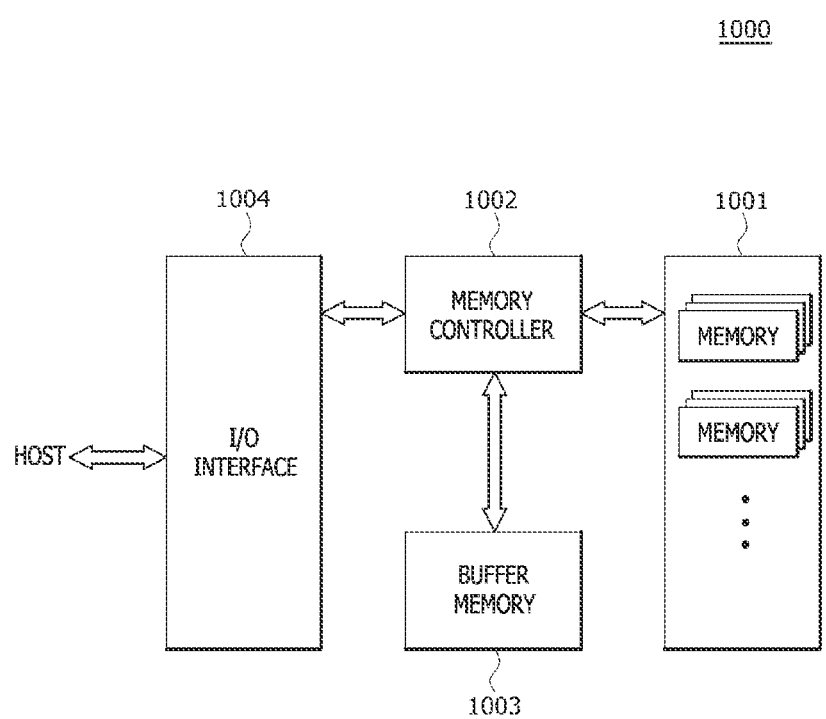
FIG. 11 is a diagram illustrating a representation of an example of the configuration of an electronic system to which the semiconductor device illustrated in FIG. 1 is applied.

The setting signal input circuit 11 may generate an internal setting signal WRAPC when a command for an auto-precharge operation is inputted by being included in a setting signal CA together with a command for a write operation. The setting signal input circuit 11 may generate the internal setting signal WRAPC based on a chip select signal CS, a dock CLK and the setting signal CA. The setting signal input circuit 11 may generate the internal setting signal WRAPC by decoding the setting signal CA inputted in synchronization with the chip select signal CS and the clock CLK. The internal setting signal WRAPC may be generated to perform the write operation accompanied by the auto-precharge operation. The write operation accompanied by the auto-precharge operation may be performed in such a manner that the auto-precharge operation is performed after the write operation is performed. The logic level combination of the setting signal CA inputted to generate the internal setting signal WRAPC may be set variously depending on an embodiment. The setting signal CA, the chip select signal CS and the clock CLK may be applied from an external device (not illustrated) of the semiconductor device 1. The external device of the semiconductor device 1 may be a memory controller (1002 of FIG. 11) or a host (HOST of FIG. 11). The number of bits included in the setting signal CA may be set variously depending on an embodiment.

The operation flag generation circuit 13 may receive the internal setting signal WRAPC from the setting signal input circuit 11, and may receive an internal clock ICLK from the dock buffer 15. The operation flag generation circuit 13 may generate an operation flag WAPF from the internal setting signal WRAPC based on a latency signal CWL, a burst length signal SBL and the internal clock ICLK, The latency signal CWL may be set to a logic level combination corresponding to a write latency. For example, when a latency signal CWL<3:1> is '001,' a write latency may be set to 1, and when the latency signal CWL<3:1> is '010,' a write latency may be set to 2. Here, when the latency signal CWL<3:1> is '001' may mean that the third bit CWL<3> of the latency signal CWL<3:1> and the second bit CWL<2> of the latency signal CWL<3:1> are logic low levels and the first bit CWL<1> of the latency signal CWL<3:1> is a logic high level. The burst length signal SBL may be set to a logic level combination corresponding to a burst length. For example, when the burst length signal SBL is '001,' a burst length may be set to 8, and when the burst length signal SBL is '010,' a burst length may be set to 16. The operation flag generation circuit 13 may generate the operation flag WAPF at a time when a flag period set based on a write latency and a burst length elapses from a time when the internal setting signal WRAPC is generated. The flag period is set to WL+(BL/2)+1 tCK. Here, 'WL' means a write latency, 'BL' means a burst length, and tCK means one cycle period of the internal dock ICLK. For example, when a write latency is set to 4 and a burst length is set to 16, the operation flag generation circuit 13 may generate the internal setting signal WRAPC as the operation flag WAPF at a time when a flag period set to a 13(4+(16/2)+1)-cycle period of the internal dock ICLK elapses.

The clock buffer 15 may receive the clock CLK from the external device. The clock buffer 15 may buffer the clock CLK and thereby generate the internal clock ICLK. The divided clock generation circuit 17 may receive the operation flag WAPF from the operation flag generation circuit 13, and may receive the internal clock ICLK from the clock buffer 15. The divided clock generation circuit 17 may generate a first divided clock CLK2N, a second divided clock CLK4N and a third divided clock CLK8N based on the operation flag WAPF and the internal clock ICLK. The divided clock generation circuit 17 may generate the first divided clock CLK2N by dividing the internal clock ICLK. The first divided clock CLK2N may be generated as a divide-by-2 signal of the internal clock ICLK. The cycle of the first divided clock CLK2N may be set to be two times larger than the cycle of the internal clock ICLK. The divided clock generation circuit 17 may generate the second divided clock CLK4N by dividing the first divided clock CLK2N. The second divided clock CLK4N may be generated as a divide-by-4 signal of the internal clock ICLK. The cycle of the second divided clock CLK4N may be set to be four times larger than the cycle of the internal clock ICLK. The divided clock generation circuit 17 may generate the third divided clock CLK8N by dividing the second divided clock CLK4N. The third divided dock CLK8N may be generated as a divide-by-8 signal of the internal clock ICLK. The cycle of the third divided clock CLK8N may be set to be eight times larger than the cycle of the internal clock ICLK. The divided clock generation circuit 17 may reset the second divided clock CLK4N and the third divided clock CLK8N when the operation flag WAPF is generated. The second divided clock CLK4N and the third divided clock CLK8N may be generated by being aligned based on the operation flag WAPF. The auto-precharge pulse generation circuit 19 may stably generate an auto-precharge pulse AP_P based on the second divided clock CLK4N and the third divided clock CLK8N which are reset. The configuration and operation of the divided clock generation circuit 17 will be described again with reference to FIGS. 2 to 5.

The auto-precharge pulse generation circuit 19 may generate the auto-precharge pulse AP_P by shifting the operation flag WAPF by a pulse generation period set by a period code WRC based on the first divided clock CLK2N and the third divided clock CLK8N. The period code WRC may be set to a logic level combination corresponding to the pulse generation period. For example, when a period code WRC<6:1> is '001010,' a pulse generation period may be set to a 10 cycle period of the internal clock ICLK, and when the period code WRC<6:1> is '110110,' a pulse generation period may be set to a 54 cycle period of the internal dock ICLK. The pulse generation period may be set as a write recovery time (tWR). The write recovery time is defined as a minimum time required until data is written to a memory cell during a write operation. The auto-precharge pulse generation circuit 19 may generate the auto-precharge pulse AP_P by shifting the operation flag WAPF in synchronization with the first divided clock CLK2N and then shifting a resultant signal in synchronization with the third divided clock CLK8N. The configuration and operation of the auto-precharge pulse generation circuit 19 will be described again with reference to FIGS. 6 to 10.

Figure 2:
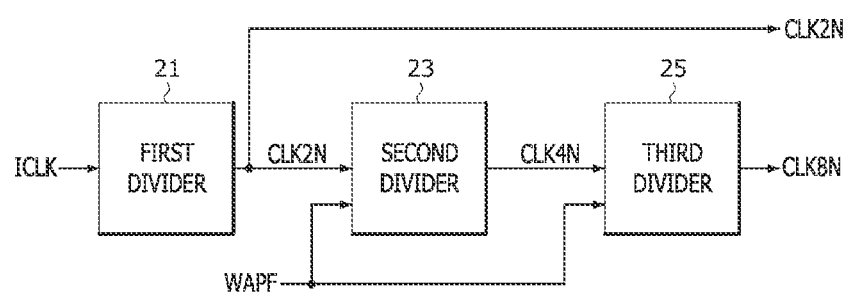
FIG. 2 is a block diagram illustrating a representation of an example of the configuration of a divided clock generation circuit, included in the semiconductor device illustrated in FIG. 1, in accordance with an embodiment of the disclosure.

Referring to FIG. 2, the divided clock generation circuit 17 may include a first divider 21, a second divider 23 and a third divider 25. The first divider 21 may receive the internal clock ICLK from the clock buffer 15. The first divider 21 may divide the internal clock ICLK and thereby generate and output the first divided clock CLK2N. The first divided clock CLK2N may be generated as a divide-by-2 signal of the internal clock ICLK. The second divider 23 may receive the first divided clock CLK2N from the first divider 21. The second divider 23 may divide the first divided clock CLK2N and thereby generate the second divided clock CLK4N. The second divided clock CLK4N may be generated as a divide-by-4 signal of the internal clock ICLK. The second divider 23 may reset the second divided clock CLK4N when the operation flag WAPF is generated, The third divider 25 may receive the second divided dock CLK4N from the second divider 23. The third divider 25 may divide the second divided dock CLK4N and thereby generate and output the third divided clock CLK8N. The third divided dock CLK8N may be generated as a divide-by-8 signal of the internal clock ICLK. The third divider 25 may reset the third divided clock CLK8N when the operation flag WAPF is generated.

Figure 3:
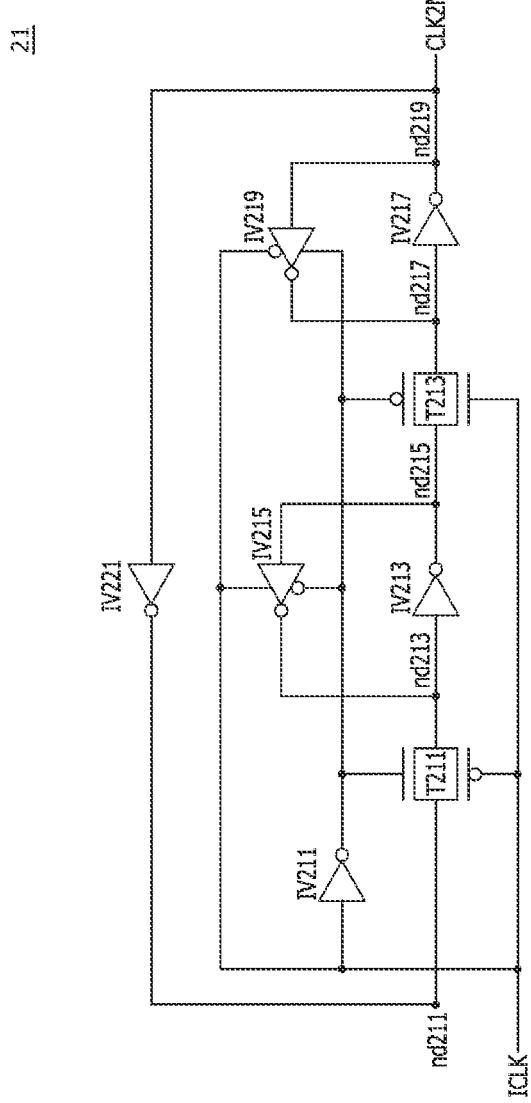
FIG. 3 is a circuit diagram illustrating a representation of an example of a first divider, included in the divided dock generation circuit illustrated in FIG. 2, in accordance with an embodiment of the disclosure.

Referring to FIG. 3, the first divider 21 may include inverters IV211, IV213, IV215, IV217, IV219 and W221 and transfer gates T211 and T213. The inverter IV211 may invert and buffer the internal clock ICLK and output an output signal. The transfer gate T211 may be turned on when the internal clock ICLK is a logic low level and transfer the signal of a node nd211 to a node nd213. The inverter IV213 may invert and buffer the signal of the node nd213 and output an output signal to a node nd215. The inverter IV215 may invert and buffer the signal of the node nd215 when the internal clock ICLK is a logic high level and output an output signal to the node nd213. The transfer gate T213 may be turned on when the internal clock ICLK is a logic high level and transfer the signal of the node nd215 to a node nd217. The inverter IV217 may invert and buffer the signal of the node nd217 and output the first divided clock CLK2N through a node nd219. The inverter IV219 may invert and buffer the signal of the node nd219 when the internal clock ICLK is a logic low level and output an output signal to the node nd217. The inverter IV221 may invert and buffer the signal of the node nd219 and output an output signal to the node nd211. The first divider 21 may invert the logic level of the first divided dock CLK2N through the transfer gates T211 and T213 and the inverters W213, W217 and IV221 which are sequentially turned on during one cycle period of the internal dock ICLK. Through such an operation, the first divider 21 may generate the first divided dock CLK2N which has a cycle two times larger than the cycle of the internal dock ICLK.

Figure 4:
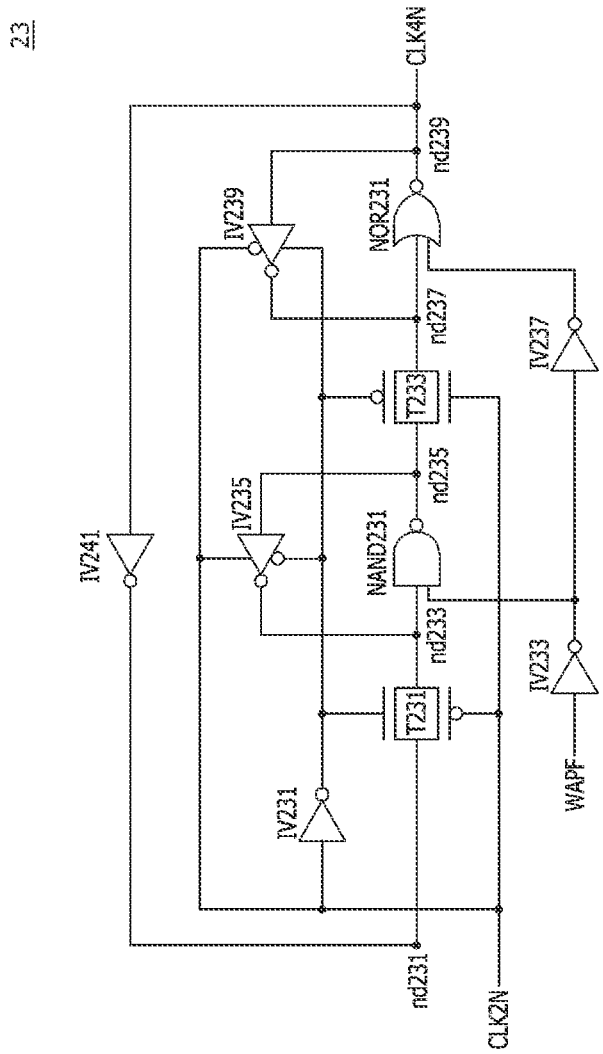
FIG. 4 is a circuit diagram illustrating a representation of an example of a second divider, included in the divided dock generation circuit illustrated in FIG. 2, in accordance with an embodiment of the disclosure.

Referring to FIG. 4, the second divider 23 may include inverters IV231, IV233, IV235, IV237, IV239 and IV241, transfer gates T231 and T233, a NAND gate NAND231 and a NOR gate NOR231. The inverter IV231 may invert and buffer the first divided clock CLK2N and output an output signal. The transfer gate T231 may be turned on when the first divided clock CLK2N is a logic low level and transfer the signal of a node nd231 to a node nd233. The inverter IV233 may invert and buffer the operation flag WAPF and output an output signal. The NAND gate NAND231 may invert and buffer the signal of the node nd233 when the operation flag WAPF is a logic low level and output an output signal to a node nd235. The NAND gate NAND231 may set the node nd235 to a logic high level when the operation flag WAPF is generated at a logic high level. The inverter IV235 may invert and buffer the signal of the node nd235 when the first divided clock CLK2N is a logic high level and output an output signal to the node nd233. The transfer gate T233 may be turned on when the first divided dock CLK2N is a logic high level and transfer the signal of the node nd235 to a node nd237. The inverter IV237 may invert and buffer the output signal of the inverter IV233 and output an output signal. The NOR gate NOR231 may invert and buffer the signal of the node nd237 when the operation flag WAPF is a logic low level and output the second divided clock CLK4N through a node nd239. The NOR gate NOR231 may reset the second divided clock CLK4N, outputted through the node nd239, to a logic low level when the operation flag WAPF is generated at a logic high level. The inverter IV239 may invert and buffer the signal of the node nd239 when the first divided clock CLK2N is a logic low level and output an output signal to the node nd237. The inverter IV241 may invert and buffer the signal of the node nd239 and output an output signal to the node nd231. The second divider 23 may invert the logic level of the second divided clock CLK4N through the transfer gates T231 and T233, the NAND gate NAND231, the NOR gate NOR231 and the inverter IV241 which are sequentially turned on during one cycle period of the first divided clock CLK2N. Through such an operation, the second divider 23 may generate the second divided clock CLK4N which has a cycle two times larger than the cycle of the first divided clock CLK2N.

Figure 5:
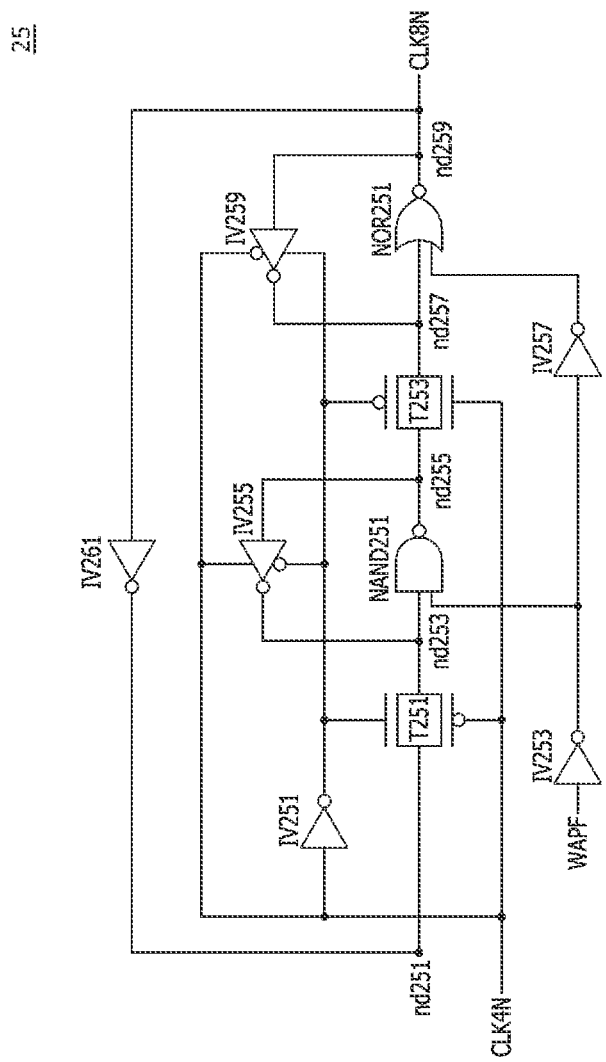
FIG. 5 is a circuit diagram illustrating a representation of an example of a third divider, included in the divided dock generation circuit illustrated in FIG. 2, in accordance with an embodiment of the disclosure.

Referring to FIG. 5, the third divider 25 may include inverters IV251, IV253, IV255, IV257, IV259 and IV261, transfer gates T251 and T253, a NAND gate NAND251 and a NOR gate NOR251. The inverter IV251 may invert and buffer the second divided dock CLK4N and output an output signal. The transfer gate T251 may be turned on when the second divided clock CLK4N is a logic low level and transfer the signal of a node nd251 to a node nd253. The inverter IV253 may invert and buffer the operation flag WAPF and output an output signal. The NAND gate NAND251 may invert and buffer the signal of the node nd253 when the operation flag WAPF is a logic low level and output an output signal to a node nd255. The NAND gate NAND251 may reset the node nd255 to a logic high level when the operation flag WAPF is generated at a logic high level. The inverter IV255 may invert and buffer the signal of the node nd255 when the second divided clock CLK4N is a logic high level and output an output signal to the node nd253. The transfer gate T253 may be turned on when the second divided clock CLK4N is a logic high level and transfer the signal of the node nd255 to a node nd257. The inverter IV257 may invert and buffer the output signal of the inverter IV253 and output an output signal. The NOR gate NOR251 may invert and buffer the signal of the node nd257 when the operation flag WAPF is a logic low level and output the third divided clock CLKSN through a node nd259. The NOR gate NOR251 may set the third divided clock CLKBN, outputted through the node nd259, to a logic low level when the operation flag WAPF is generated at a logic high level. The inverter IV259 may invert and buffer the signal of the node nd259 when the second divided clock CLK4N is a logic low level and output an output signal to the node nd257. The inverter IV261 may invert and buffer the signal of the node nd259 and output an output signal to the node nd251. The third divider 25 may invert the logic level of the third divided dock CLKBN through the transfer gates T251 and T253, the NAND gate NAND251, the NOR gate NOR251 and the inverter IV261 which are sequentially turned on during one cycle period of the second divided clock CLK4N. Through such an operation, the third divider 25 may generate the third divided clock CLK8N which has a cycle two times larger than the cycle of the second divided clock CLK4N.

Figure 6:
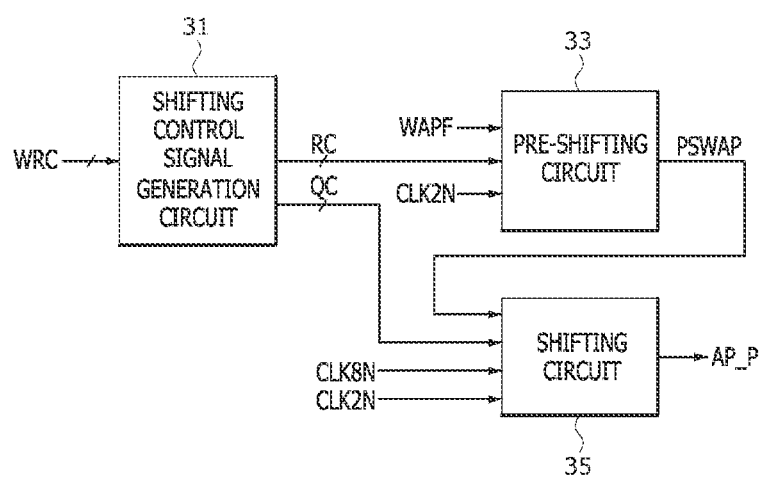
FIG. 6 is a block diagram illustrating a representation of an example of the configuration of an auto-precharge pulse generation circuit, included in the semiconductor device illustrated in FIG. 1, in accordance with an embodiment of the disclosure.

Referring to FIG. 6, the auto-precharge pulse generation circuit 19 may include a shifting control signal generation circuit 31, a pre-shifting circuit 33 and a shifting circuit 35.

The shifting control signal generation circuit 31 may generate a quotient code QC and a remainder code RC based on the period code WRC. The quotient code QC may be set to have a logic level combination corresponding to a quotient when a pulse generation period set by the period code WRC is divided by 16, and the remainder code RC may be set to have a logic level combination corresponding to a remainder when the pulse generation period is divided by 16. The quotient code QC and the remainder code RC may be set as a quotient and a remainder when a pulse generation period is divided by various natural numbers. An operation in which the quotient code QC and the remainder code RC are generated in the shifting control signal generation circuit 31 will be described later with reference to FIG. 7.

The pre-shifting circuit 33 may generate a shifting operation flag PSWAP by shifting the operation flag WAPF by a pre-shifting period set by the remainder code RC, in synchronization with the first divided dock CLK2N. The pre-shifting period may be set as a period from a time when the operation flag WAPF is generated to a time when the first divided dock CLK2N is generated by the number of times set by the remainder code RC. In the present embodiment, a time when the first divided dock CLK2N is generated may be set as a rising edge at which the first divided dock CLK2N transitions from a logic low level to a logic high level. However, this is only an example, and the disclosure is not limited thereto, More configurations and operations of the pre-shifting circuit 33 will be described later with reference to FIG. 8.

The shifting circuit 35 may generate the auto-precharge pulse AP_P by shifting the shifting operation flag PSWAP by a shifting period set based on the quotient code QC, in synchronization with the third divided clock CLK8N. The shifting period may be set as a period from a time when the shifting operation flag PSWAP is generated to a time when the third divided clock CLK8N is generated by the number of times set by the quotient code QC. In the present embodiment, a time when the third divided clock CLK8N is generated may be set as a rising edge at which the third divided clock CLK8N transitions from a logic low level to a logic high level. However, this is only an example, and the disclosure is not limited thereto. More configurations and operations of the shifting circuit 35 will be described later with reference to FIG. 9.

With reference to the table given in FIG. 7, an example of the operation of the shifting control signal generation circuit 31 of receiving a period code WRC<6:1> of 6 bits and generating a quotient code QC<3:1> of 3 bits and a remainder code RC<7:1> of 7 bits will be described below. As illustrated in FIG. 7, when the period code WRC<6:1> of a binary number '110110' is inputted to set a pulse generation period corresponding to a decimal number '54,' the quotient code QC<3:1> generated in the shifting control signal generation circuit 31 is generated as a binary number '111' corresponding to a decimal number '3' that corresponds to a quotient when the decimal number '54' as the pulse generation period is divided by 16, and the remainder code RC<7:1> generated in the shifting control signal generation circuit 31 is generated as a binary number '0000111' corresponding to a decimal number '6' that corresponds to a remainder when the decimal number '54' as the pulse generation period is divided by 16. Here, '1' means a logic high level ('H'), and '0' means a logic low level ('L'). In this example, the expression 'a binary number corresponding to a decimal number' does not mean a binary number generated when the decimal number is converted, but means a binary number in a relationship corresponding to the decimal number. When the period code WRC<6:1> of a binary number '101110' is inputted to set a pulse generation period corresponding to a decimal number '46,' the quotient code QC<3:1> generated in the shifting control signal generation circuit 31 is generated as a binary number '011' corresponding to a decimal number '2' that corresponds to a quotient when the decimal number '46' as the pulse generation period is divided by 16, and the remainder code RC<7:1> generated in the shifting control signal generation circuit 31 is generated as a binary number '1111111' corresponding to a decimal number '14' that corresponds to a remainder when the decimal number '46' as the pulse generation period is divided by 16. When the period code WRC<6:1> of a binary number '010000' is inputted to set a pulse generation period corresponding to a decimal number '16,' the quotient code QC<3:1> generated in the shifting control signal generation circuit 31 is generated as a binary number '001' corresponding to a decimal number '1' that corresponds to a quotient when the decimal number '16' as the pulse generation period is divided by 16, and the remainder code RC<7:1> generated in the shifting control signal generation circuit 31 is generated as a binary number '0000000' corresponding to a decimal number '0' that corresponds to a remainder when the decimal number '16' as the pulse generation period is divided by 16. When the period code WRC<6:1> of a binary number '000010' is inputted to set a pulse generation period corresponding to a decimal number '2,' the quotient code QC<3:1> generated in the shifting control signal generation circuit 31 is generated as a binary number '000' corresponding to a decimal number '0' that corresponds to a quotient when the decimal number '2' as the pulse generation period is divided by 16, and the remainder code RC<7:1> generated in the shifting control signal generation circuit 31 is generated as a binary number '0000010' corresponding to a decimal number '2' that corresponds to a remainder when the decimal number '2' as the pulse generation period is divided by 16.

Figure 8:
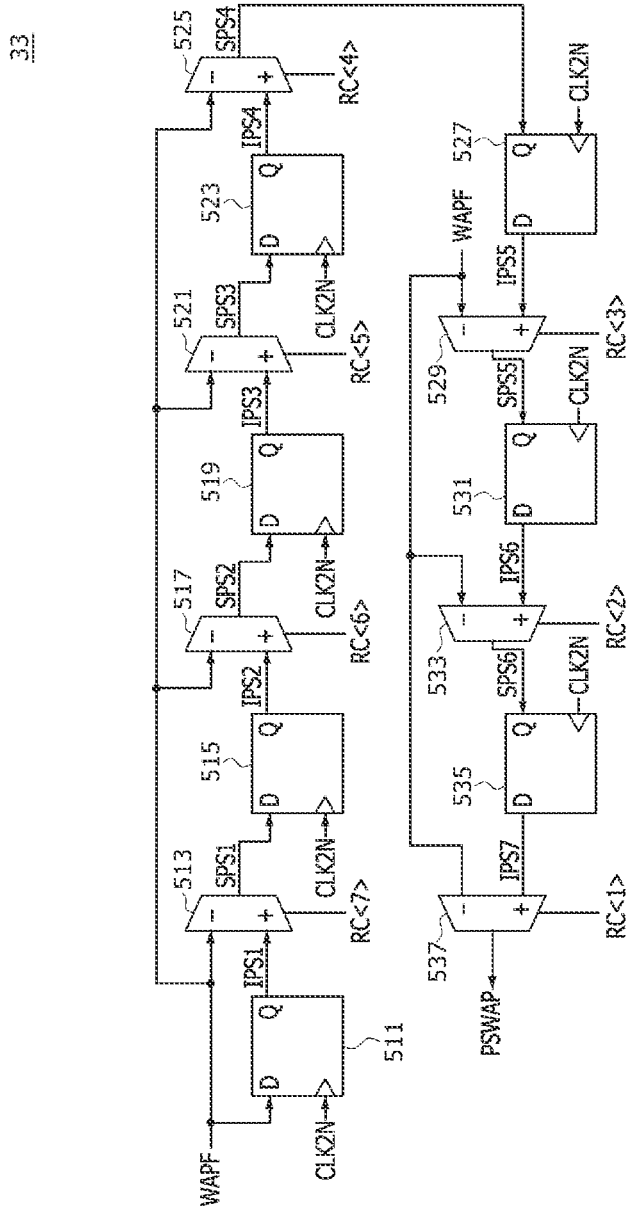
FIG. 8 is a circuit diagram illustrating a representation of an example of a pre-shifting circuit, included in the auto-precharge pulse generation circuit illustrated in FIG. 6, in accordance with an embodiment of the disclosure.

Referring to FIG. 8, the pre-shifting circuit 33 may include a first pre-shifting pulse generation circuit 511, a first pre-selection circuit 513, a second pre-shifting pulse generation circuit 515, a second pre-selection circuit 517, a third pre-shifting pulse generation circuit 519, a third pre-selection circuit 521, a fourth pre-shifting pulse generation circuit 523, a fourth pre-selection circuit 525, a fifth pre-shifting pulse generation circuit 527, a fifth pre-selection circuit 529, a sixth pre-shifting pulse generation circuit 531, a sixth pre-selection circuit 533, a seventh pre-shifting pulse generation circuit 535 and a seventh pre-selection circuit 537.

The first pre-shifting pulse generation circuit 511 may be implemented by a flip-flop. The first pre-shifting pulse generation circuit 511 may latch the operation flag WAPF in synchronization with the first divided clock CLK2N, and may output the latched operation flag WAPF as a first pre-shifting pulse IPS1. The first pre-selection circuit 513 may output the operation flag WAPF or the first pre-shifting pulse IPS1 as a first pre-selection pulse SPS1 based on the seventh bit RC 7> of the remainder code RC<7:1>. The first pre-selection circuit 513 may output the operation flag WAPF as the first pre-selection puke SPS1 when the seventh hit RC<7> of the remainder code RC<7:1> is a logic low level, and may output the first pre-shifting puke IPS1 as the first pre-selection pulse SPS1 when the seventh bit RC<7> of the remainder code RC<7:1> is a logic high level.

The second pre-shifting pulse generation circuit 515 may be implemented by a flip-flop. The second pre-shifting pulse generation circuit 515 may latch the first pre-selection pulse SPS1 in synchronization with the first divided clock CLK2N, and may output the latched first pre-selection pulse SPS1 as a second pre-shifting pulse IPS2. The second pre-selection circuit 517 may output the operation flag WAPF or the second pre-shifting pulse IPS2 as a second pre-selection pulse SPS2 based on the sixth bit RC<6> of the remainder code RC<7:1>. The second pre-selection circuit 517 may output the operation flag WAPF as the second pre-selection pulse SPS2 when the sixth bit RC<6> of the remainder code RC<7:1> is a logic low level, and may output the second pre-shifting pulse IPS2 as the second pre-selection pulse SPS2 when the sixth bit RC<6> of the remainder code RC<7:1> is a logic high level.

The third pre-shifting pulse generation circuit 519 may be implemented by a flip-flop. The third pre-shifting pulse generation circuit 519 may latch the second pre-selection pulse SPS2 in synchronization with the first divided dock CLK2N, and may output the latched second pre-selection pulse SPS2 as a third pre-shifting pulse IPS3. The third pre-selection circuit 521 may output the operation flag WAPF or the third pre-shifting pulse IPS3 as a third pre-selection pulse SPS3 based on the fifth bit RC<5> of the remainder code RC<7:1>. The third pre-selection circuit 521 may output the operation flag WAPF as the third pre-selection pulse SPS3 when the fifth bit RC<5> of the remainder code RC<7:1> is a logic low level, and may output the third pre-shifting pulse IPS3 as the third pre-selection pulse SPS3 when the fifth bit RC<5> of the remainder code RC<7:1> is a logic high level.

The fourth pre-shifting pulse generation circuit 523 may be implemented by a flip-flop. The fourth pre-shifting pulse generation circuit 523 may latch the third pre-selection pulse SPS3 in synchronization with the first divided clock CLK2N, and may output the latched third pre-selection pulse SPS3 as a fourth pre-shifting pulse IPS4. The fourth pre-selection circuit 525 may output the operation flag WAPF or the fourth pre-shifting pulse IPS4 as a fourth pre-selection pulse SPS4 based on the fourth bit RC<4> of the remainder code RC<7:1>. The fourth pre-selection circuit 525 may output the operation flag WAPF as the fourth pre-selectionpulse SPS4 when the fourth bit RC<4> of the remainder code RC<7:1> is a logic low level, and may output the fourth pre-shifting pulse IPS4 as the fourth pre-selection pulse SPS4 when the fourth bit RC<4> of the remainder code RC<7:1> is a logic high level.

The fifth pre-shifting pulse generation circuit 527 may be implemented by a flip-flop. The fifth pre-shifting pulse generation circuit 527 may latch the fourth pre-selection pulse SPS4 in synchronization with the first divided dock CLK2N, and may output the latched fourth pre-selection puke SPS4 as a fifth pre-shifting puke IPS5. The fifth pre-selection circuit 529 may output the operation flag WAPF or the fifth pre-shifting puke IPS5 as a fifth pre-selection puke SPS5 based on the third bit RC<3> of the remainder code RC<7:1>. The fifth pre-selection circuit 529 may output the operation flag WAPF as the fifth pre-selection pulse SPS5 when the third bit RC<3> of the remainder code RC<7:1> is a logic low level, and may output the fifth pre-shifting pulse IPS5 as the fifth pre-selection pulse SPS5 when the third bit RC<3> of the remainder code RC<7:1> is a logic high level.

The sixth pre-shifting pulse generation circuit 531 may be implemented by a flip-flop. The sixth pre-shifting pulse generation circuit 531 may latch the fifth pre-selection pulse SPS5 in synchronization with the first divided clock CLK2N, and may output the latched fifth pre-selection pulse SPS5 as a sixth pre-shifting pulse IPS6. The sixth pre-selection circuit 533 may output the operation flag WAPF or the sixth pre-shifting pulse IPS6 as a sixth pre-selection pulse SPS6 based on the second bit RC<2> of the remainder code RC<7:1>. The sixth pre-selection circuit 533 may output the operation flag WAPF as the sixth pre-selection pulse SPS6 when the second bit RC<2> of the remainder code RC<7:1> is a logic low level, and may output the sixth pre-shifting pulse IPS6 as the sixth pre-selection pulse SPS6 when the second bit RC<2> of the remainder code RC<7:1> is a logic high level.

The seventh pre-shifting pulse generation circuit 535 may be implemented by a flip-flop. The seventh pre-shifting pulse generation circuit 535 may latch the sixth pre-selection pulse SPS6 in synchronization with the first divided clock CLK2N, and may output the latched sixth pre-selection pulse SPS6 as a seventh pre-shifting pulse IPS7. The seventh pre-selection circuit 537 may output the operation flag WAPF or the seventh pre-shifting pulse IPS7 as the shifting operation flag PSWAP based on the first bit RC<1> of the remainder code RC<7:1>. The seventh pre-selection circuit 537 may output the operation flag WAPF as the shifting operation flag PSWAP when the first bit RC<1> of the remainder code RC<7:1> is a logic low level, and may output the seventh pre-shifting pulse IPS7 as the shifting operation flag PSWAP when the first bit RC<1> of the remainder code RC<7:1> is a logic high level.

The pre-shifting circuit 33 may generate the shifting operation flag PSWAP by shifting the operation flag WAPF by a pre-shifting period set by the remainder code RC, in synchronization with the first divided dock CLK2N. In detail, examples of the operation of the pre-shifting circuit 33 when the remainder code RC<7:1> of 7 bits is inputted are as follows. When the remainder code RC<7:1> is '1111111,' the pre-shifting circuit 33 may generate the shifting operation flag PSWAP by shifting the operation flag WAPF until, after the operation flag WAPF is generated, the rising edge of the first divided clock CLK2N is generated seven times. When the remainder code RC<7:1> is '0111111,' the pre-shifting circuit 33 may generate the shifting operation flag PSWAP by shifting the operation flag WAPF until, after the operation flag WAPF is generated, the rising edge of the first divided clock CLK2N is generated six times. When the remainder code RC<7:1> is '0011111,' the pre-shifting circuit 33 may generate the shifting operation flag PSWAP by shifting the operation flag WAPF until, after the operation flag WAPF is generated, the rising edge of the first divided clock CLK2N is generated five times. When the remainder code RC<7:1> is '0001111,' the pre-shifting circuit 33 may generate the shifting operation flag PSWAP by shifting the operation flag WAPF until, after the operation flag WAPF is generated, the rising edge of the first divided clock CLK2N is generated four times. When the remainder code RC<7:1> is '0000111,' the pre-shifting circuit 33 may generate the shifting operation flag PSWAP by shifting the operation flag WAPF until, after the operation flag WAPF is generated, the rising edge of the first divided clock CLK2N is generated three times. When the remainder code RC<7:1> is '0000011,' the pre-shifting circuit 33 may generate the shifting operation flag PSWAP by shifting the operation flag WAPF until, after the operation flag WAPF is generated, the rising edge of the first divided clock CLK2N is generated two times. When the remainder code RC<7:1> is '0000001,' the pre-shifting circuit 33 may generate the shifting operation flag PSWAP by shifting the operation flag WAPF until, after the operation flag WAPF is generated, the rising edge of the first divided clock CLK2N is generated one time. When the remainder code RC<7:1> is '0000000,' the pre-shifting circuit 33 may output the operation flag WAPF as the shifting operation flag PSWAP.

Figure 9:
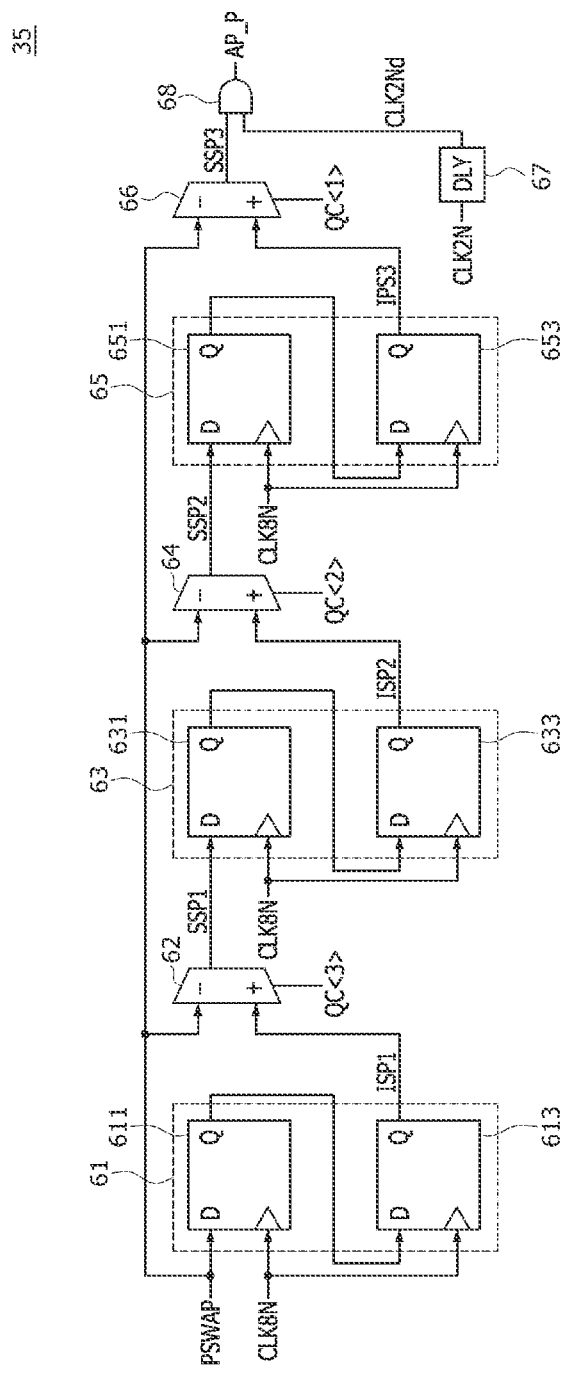
FIG. 9 is a circuit diagram illustrating a representation of an example of a shifting circuit, included in the auto-precharge pulse generation circuit illustrated in FIG. 6, in accordance with an embodiment of the disclosure.

Referring to FIG. 9, the shifting circuit 35 may include a first shifting pulse generation circuit 61, a first selection circuit 62, a second shifting pulse generation circuit 63, a second selection circuit 64, a third shifting pulse generation circuit 65, a third selection circuit 66, a clock delay 67 and an auto-precharge pulse output circuit 68.

The first shifting pulse generation circuit 61 may include a first flip-flop 611 and a second flip-flop 613. The first flip-flop 611 may latch the shifting operation flag PSWAP in synchronization with the third divided clock CLKSN, and may output the latched shifting operation flag PSWAP. The second flip-flop 613 may latch the output signal of the first flip-flop 611 in synchronization with the third divided clock CLK8N, and may output the latched output signal of the first flip-flop 611 as a first shifting pulse ISP1. The first selection circuit 62 may output the shifting operation flag PSWAP or the first shifting pulse ISP1 as a first selection pulse SSP1 based on the third bit QC<3> of the quotient code QC<3:1>. The first selection circuit 62 may output the shifting operation flag PSWAP as the first selection pulse SSP1 when the third bit QC<3> of the quotient code QC<3:1> is a logic low level, and may output the first shifting pulse ISP1 as the first selection pulse SSP1 when the third bit QC<3> of the quotient code QC<3:1> is a logic high level.

The second shifting pulse generation circuit 63 may include a third flip-flop 631 and a fourth flip-flop 633. The third flip-flop 631 may latch the first selection pulse SSP1 in synchronization with the third divided clock CLK8N, and may output the latched first selection pulse SSP1. The fourth flip-flop 633 may latch the output signal of the third flip-flop 631 in synchronization with the third divided clock CLK8N, and may output the latched output signal of the third flip-flop 631 as a second shifting pulse ISP2. The second selection circuit 64 may output the shifting operation flag PSWAP or the second shifting pulse ISP2 as a second selection pulse SSP2 based on the second bit QC<2> of the quotient code QC<3:1>. The second selection circuit 64 may output the shifting operation flag PSWAP as the second selection pulse SSP2 when the second bit QC<2> of the quotient code QC<3:1> is a logic low level, and may output the second shifting pulse ISP2 as the second selection pulse SSP2 when the second bit QC<2> of the quotient code QC<3:1> is a logic high level.

The third shifting puke generation circuit 65 may include a fifth flip-flop 651 and a sixth flip-flop 653. The fifth flip-flop 651 may latch the second selection pulse SSP2 in synchronization with the third divided clock CLK8N, and may output the latched second selection puke SSP2. The sixth flip-flop 653 may latch the output signal of the fifth flip-flop 651 in synchronization with the third divided dock CLK8N, and may output the latched output signal of the fifth flip-flop 651 as a third shifting pulse ISP3. The third selection circuit 66 may output the shifting operation flag PSWAP or the third shifting pulse ISP3 as a third selection pulse SSP3 based on the first bit QC<1> of the quotient code QC<3:1>. The third selection circuit 66 may output the shifting operation flag PSWAP as the third selection pulse SSP3 when the first bit QC<1> of the quotient code QC<3:1> is a logic low level, and may output the third shifting puke ISP3 as the third selection puke SSP3 when the first bit QC<1> of the quotient code QC<3:1> is a logic high level.

The clock delay 67 may generate a delayed divided dock CLK2Nd based on the first divided dock CLK2N. The dock delay 67 may generate the delayed divided clock CLK2Nd by delaying the first divided clock CLK2N by a preset delay period. The delay period by which the clock delay 67 delays the first divided clock CLK2N may be set variously depending on an embodiment.

The auto-precharge pulse output circuit 68 may receive the third selection pulse SSP3 from the third selection circuit 66, and may receive the delayed divided clock CLK2Nd from the clock delay 67. The auto-precharge pulse output circuit 68 may be implemented by an AND gate, and may perform an AND logic operation on the third selection pulse SSP3 and the delayed divided clock CLK2Nd. The auto-precharge pulse output circuit 68 may output the third selection pulse SSP3 as the auto-precharge pulse AP_P during a period in which the delayed divided clock CLK2Nd is generated at a logic high level.

The shifting circuit 35 may generate the auto-precharge pulse AP_P by shifting the shifting operation flag PSWAP by a shifting period set by the quotient code QC, in synchronization with the third divided clock CLK8N. In detail, examples of the operation of the shifting circuit 35 when the quotient code QC<3:1> of 3 bits is inputted are as follows. When the quotient code QC<3:1> is '111,' the shifting circuit 35 may generate the auto-precharge pulse AP_P by shifting the shifting operation flag PSWAP until, after the shifting operation flag PSWAP is generated, the rising edge of the third divided clock CLK8N is generated three times. When the quotient code QC<3:1> is '011,' the shifting circuit 35 may generate the auto-precharge pulse AP_P by shifting the shifting operation flag PSWAP until, after the shifting operation flag PSWAP is generated, the rising edge of the third divided dock CLK8N is generated two times. When the quotient code QC<3:1> is '001,' the shifting circuit 35 may generate the auto-precharge pulse AP_P by shifting the shifting operation flag PSWAP until, after the shifting operation flag PSWAP is generated, the rising edge of the third divided clock CLK8N is generated one time.

When the quotient code QC<3:1> is '000,' the shifting circuit 35 may output the shifting operation flag PSWAP as the auto-precharge pulse AP_P.

Figure 10:
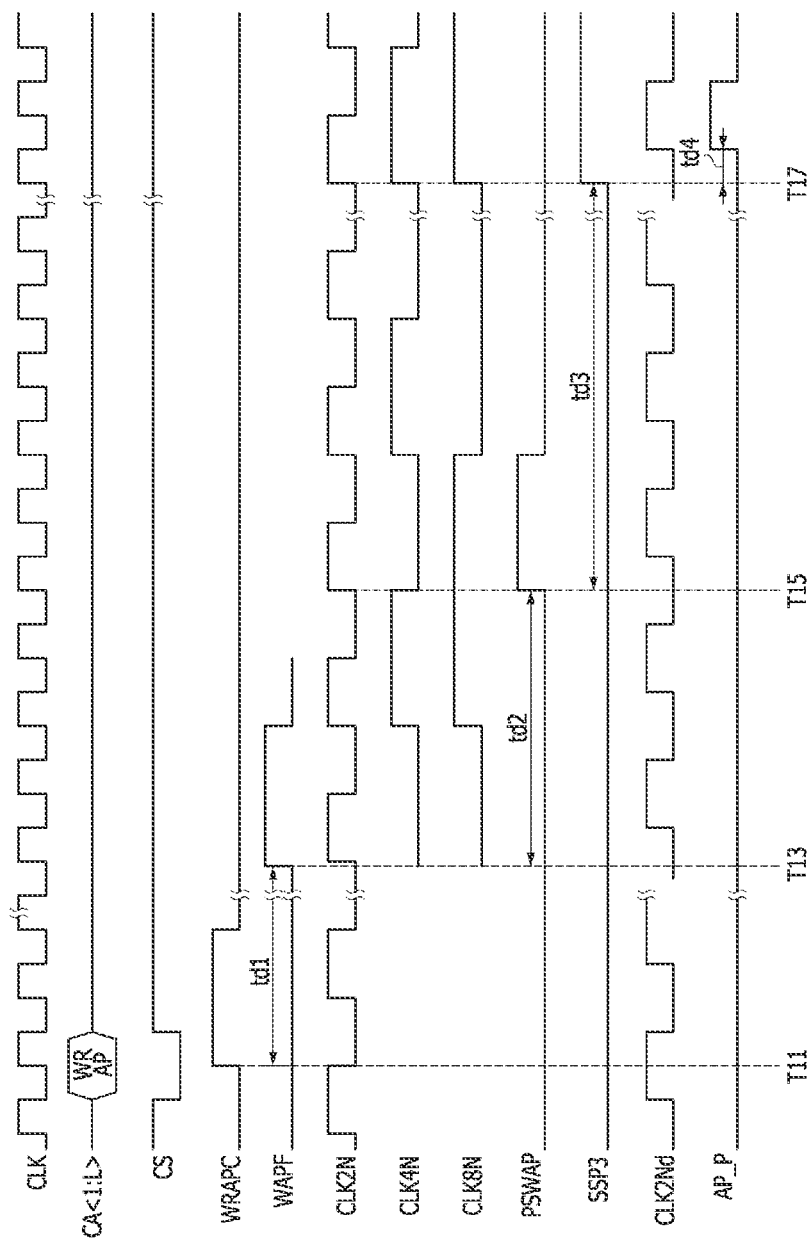
FIG. 10 is a representation of an example of a timing diagram to assist in the explanation of the operation of the semiconductor device illustrated in FIG. 1.

The operation of the semiconductor device 1 will be described below with reference to FIG. 10, assuming that the period code WRC<6:1> of a binary number '110110' is inputted to set a pulse generation period corresponding to a decimal number '54' so the quotient code QC<3:1> of a binary number '111' corresponding to a decimal number '3' is generated and the remainder code RC<7:1> of a binary number '0000111' corresponding to a decimal number '6' is generated.

When a command AP for an auto-precharge operation is inputted, together with a command WR for a write operation, through the setting signal CA based on the chip select signal CS, the internal setting signal WRAPC is generated at a time T11. As the internal setting signal WRAPC is shifted from the time T11 by a flag period td1 set by the latency signal CWL and the burst length signal SBL, the operation flag WAPF is generated at a logic high level at a time T13.

When the operation flag WAPF is generated at the time T13, the second divided dock CLK4N and the third divided dock CLK8N are reset to logic low levels. Since a pre-shifting period td2 is set, by the remainder code RC<7:1> of the binary number '0000111,' from the time 113 at which the operation flag WAPF is generated at a logic high level to a time T15 till which the rising edge of the first divided clock CLK2N is generated three times, the shifting operation flag PSWAP is generated at a logic high level at the time T15 as the operation flag WAPF is shifted by the pre-shifting period td2.

Since a shifting period td3 is set, by the quotient code QC<3:1> of the binary number '111,' from the time T15 at which the shifting operation flag PSWAP is generated to a time T17 till which the rising edge of the third divided clock CLK8N is generated three times, the third selection pulse SSP3 is generated at a logic high level at the time T17 as the shifting operation flag PSWAP is shifted by the shifting period td3.

Since the delayed divided clock CLK2Nd is generated by shifting the first divided clock CLK2N by a delay period td4, the auto-precharge pulse AP_P is generated at a logic high level by the delayed divided clock CLK2Nd which is generated at a logic high level at a time when the delay period td4 elapses from the time T17.

The semiconductor device 1 may generate the auto-precharge pulse AP_P by shifting, using the first divided clock CLK2N and the third divided dock CLKBN, the operation flag WAPF generated from the internal setting signal WRAPC generated to perform a write operation accompanied by an auto-precharge operation. Therefore, the semiconductor device 1 may reduce area and current consumption by minimizing the use of shift registers. In addition, the semiconductor device 1 may reset the second divided clock CLK4N and the third divided clock CLK8N based on the operation flag WAPF. Therefore, the semiconductor device 1 may stably generate the auto-precharge pulse AP_P based on the second divided clock CLK4N and the third divided clock CLK8N which are aligned.

The semiconductor device 1 described above with reference to FIG. 1 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to setting signals from the memory controller 1002. The data storage 1001 may include a nonvolatile memory capable of not losing and continuously storing data even though power supply is interrupted, The nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a setting signal. The buffer memory 1003 may include the semiconductor device 1 shown in FIG. 1. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive setting signals for input/output of data from the external device and exchange data with the external device. The input/output interface 1004 may include one among various interface protocols such as USB (universal serial bus), MMC (multimediacard), PCI-E (peripheral component interconnect express), SAS (serial attached SCSI), SATA (serial advanced technology attachment), DATA. (parallel ATA), SCSI (small computer system interface), ESDI (enhanced small device interface) and IDE (integrated drive electronics).

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDRC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a shifting control signal generation circuit configured to generate a quotient code and a remainder code based on a pulse generation period;

a pre-shifting circuit configured to generate a shifting operation flag by shifting an operation flag by a pre-shifting period set based on the remainder code, in synchronization with a first divided dock; and a shifting circuit configured to generate an auto-precharge pulse by shifting the shifting operation flag by a shifting period set based on the quotient code, in synchronization with a third divided clock.

2. The semiconductor device of claim 1, further comprising:

a divided dock generation circuit configured to generate the first divided clock, a second divided clock, and the third divided clock, the first divided clock being generated by dividing an internal clock, the second divided clock being generated by dividing the first divided clock and the third divided clock being generated by dividing the second divided clock.

3. The semiconductor device of claim 2, wherein the divided clock generation circuit resets the second divided clock and the third divided clock when the operation flag is generated.

4. The semiconductor device of claim 1, further comprising:

an operation flag generation circuit configured to generate the operation flag at a time when a flag period elapses from a time when an internal setting signal is generated to perform a write operation accompanied by an auto-precharge operation.

5. The semiconductor device of claim 4, wherein the operation flag generation circuit sets the flag period based on a write latency and a burst length.

6. The semiconductor device of claim 4, further comprising:

a setting signal input circuit configured to generate the internal setting signal based on a chip select signal, a clock, and a setting signal.

7. The semiconductor device of claim 1, wherein the shifting control signal generation circuit calculates a quotient and a remainder by dividing the pulse generation period by a value set to a multiple of a cycle period of the third divided clock, generates the quotient code corresponding to the quotient, and generates the remainder code corresponding to the remainder.

8. The semiconductor device of claim 1, wherein the pre-shifting circuit comprises:

a pre-shifting pulse generation circuit configured to generate a pre-shifting pulse by shifting the operation flag in synchronization with the first divided clock; and a pre-selection circuit configured to output one of the operation flag and the pre-shifting pulse as a pre-selection signal based on the remainder code.

9. The semiconductor device of claim 1, wherein the shifting circuit comprises:

a shifting pulse generation circuit configured to generate a shifting puke by shifting the shifting operation flag in synchronization with the third divided dock; and a selection circuit configured to output one of the shifting operation flag and the shifting puke as a selection signal based on the quotient code.

* * * * *